(12) United States Patent
Chinthakindi

(10) Patent No.: US 7,643,268 B2
(45) Date of Patent: *Jan. 5, 2010

(54) HIGH CAPACITANCE DENSITY VERTICAL NATURAL CAPACITORS

(75) Inventor: Anil K. Chinthakindi, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,566

(22) Filed: Aug. 20, 2008

(65) Prior Publication Data

US 2008/0304203 A1 Dec. 11, 2008

Related U.S. Application Data

(63) Continuation of application No. 11/422,457, filed on Jun. 6, 2006, now Pat. No. 7,466,534.

(51) Int. Cl.
  H01G 4/228 (2006.01)
  H01L 27/108 (2006.01)
  H01L 29/94 (2006.01)
(52) U.S. Cl. .................. 361/306.2; 361/306.3; 257/303
(58) Field of Classification Search .............. 361/306.2, 361/306.3, 306.1; 257/303
  See application file for complete search history.

(56) References Cited

U.S. PATENT DOCUMENTS 6,297,524 B1 10/2001 Vathulya et al.
6,410,954 B1 6/2002 Sowlati et al.
6,570,210 B1 5/2003 Sowlati et al.
6,690,570 B2 2/2004 Hajimiri et al.
6,822,312 B2 11/2004 Sowlati et al.
7,466,534 B2 * 12/2008 Chinthakindi ............ 361/306.2
2002/0113292 A1 8/2002 Appel
2004/0004241 A1 1/2004 Aton
2004/0027785 A1 2/2004 Kim et al.
2005/0164465 A1 7/2005 Kim et al.
2007/0235838 A1 10/2007 Wang

FOREIGN PATENT DOCUMENTS

WO  WO 2005/104140 A1  11/2005

* cited by examiner

*Primary Examiner*—Eric Thomas
*Assistant Examiner*—David M Sinclair
(74) *Attorney, Agent, or Firm*—Gibb I.P. Law Firm, LLC; Yuanmin Cai, Esq.

(57) ABSTRACT

Disclosed are embodiments of a capacitor with inter-digitated vertical plates and a method of forming the capacitor such that the effective gap distance between plates is reduced. This gap width reduction significantly increases the capacitance density of the capacitor. Gap width reduction is accomplished during back end of the line processing by masking connecting points with nodes, by etching the dielectric material from between the vertical plates and by etching a sacrificial material from below the vertical plates. Etching of the dielectric material from between the plates forms air gaps and various techniques can be used to cause the plates to collapse in on these air gaps, once the sacrificial material is removed. Any remaining air gaps can be filled by depositing a second dielectric material (e.g., a high k dielectric), which will further increase the capacitance density and will encapsulate the capacitor in order to make the reduced distance between the vertical plates permanent.

19 Claims, 16 Drawing Sheets

HIGH CAPACITANCE DENSITY VERTICAL NATURAL CAPACITORS

CROSS-REFERENCE TO RELATED APPLICATIONS

This application is a Continuation of U.S. application Ser. No. 11/422,457 filed Jun. 6, 2006, the complete disclosure of which, in its entirety, is herein incorporated by reference.

BACKGROUND

1. Field of the Invention

The embodiments of the invention generally relate to vertical natural capacitors, and, more particularly, to a vertical natural capacitor with high capacitance density and a method of forming the capacitor.

2. Description of the Related Art

Vertical natural capacitors are currently used as capacitor devices in most of the logic and analog semiconductor technologies. As technology scaling continues, the capacitance density for such capacitors is expected to increase. However, due to the introduction of low dielectric constant material (e.g., ultra low k (i.e., k<2.2)) porous material) as the inter-level dielectric, the capacitance density increase of the vertical natural capacitance is expected to drop. It would be advantageous over the prior art to provide a method of forming a vertical natural capacitor that allows for the incorporation of a low dielectric constant material as the inter-level dielectric and still allows for device scaling accompanied by increased capacitance density.

SUMMARY

In view of the foregoing, disclosed are embodiments of a capacitor with inter-digitated vertical plates and a method of forming the capacitor such that the effective gap distance between plates is reduced (i.e., the ratio of the gap width to the plate width ranges between approximately 1:5 and 1:10). This gap width reduction significantly increases the capacitance density of the capacitor. Gap width reduction is accomplished during back end of the line processing by etching the dielectric material from between the vertical plates and by etching a sacrificial material from below the vertical plates. Etching of the dielectric material from between the plates forms air gaps and various techniques can be used to cause the plates to collapse in on these air gaps, once the sacrificial material is removed. Any remaining air gaps can be filled by depositing a second dielectric material (e.g., a high k dielectric), which will further increase the capacitance density and will encapsulate the capacitor in order to make the reduced distance between the vertical plates permanent.

More particularly, disclosed herein are embodiments of a vertical natural capacitor structure. The structure can comprise two parallel nodes with opposite polarity on a substrate (i.e., a first node with a first polarity (e.g., positive) and a second node with a second polarity (e.g., negative). These nodes form the terminals of the capacitor.

The structure also comprises a plurality of conductive plates that extend vertically from the substrate and are positioned between the two nodes. These conductive plates are alternately electrically connected to either the first node or the second node at connecting points. For example, first conductive plates can be electrically connected at one end to the first node and positioned adjacent to second conductive plates that are electrically connected at an opposite end to the second node. Each of the conductive plates further comprises a main body that is approximately planar, approximately parallel to the main body of any adjacent conductive plates and approximately perpendicular to the first and second nodes.

Additionally, a first spacing between the connecting points of any adjacent conductive plates is greater than a second spacing between the main bodies of any adjacent plates, as measured along the same axis parallel to the nodes. More specifically, at least some of the conductive plates extend outward at an angle from that node to which they are connected and comprise a curve that is angled towards the opposite node. The angle may vary from plate to plate so that the spacing between the main bodies of adjacent plates is reduced.

Furthermore, each of the conductive plates can be inter-digitated. Specifically, each plate can comprise a horizontal electrode on each of a plurality of metal levels. Thus, each metal level comprises a plurality of horizontal first conductive electrodes and a plurality of horizontal second conductive electrodes. The first and second conductive electrodes on each metal level are separated and alternately connected to the first and second nodes, respectively. Thus, each first conductive electrode has a first polarity and each second conductive electrode has a second polarity.

Each horizontal conductive electrode on each metal level is aligned in a stack with a corresponding electrode in the adjacent metal levels. The aligned horizontal electrodes are separated by an inter-level dielectric material (i.e., a first dielectric material). This dielectric material can, for example, comprise a low dielectric constant (i.e., k<3.9) or even an ultra low k (i.e., k<2.2) material. Each aligned horizontal electrode in a stack is further connected to the adjacent electrodes above and below by vias within the inter-level dielectric. Thus, the stacked electrodes form a parallel array of inter-digitated vertical plates that have alternating polarity and are separated by spaces.

The spaces between the conductive plates can be filled with a second dielectric material that is the same or different from the inter-level dielectric material. For example, this second dielectric material can comprise a high k dielectric material, where (i.e., k>5.0). This second dielectric material can further encapsulate the conductive plates so that the relative spacing between the plates is maintained.

The structure can also be formed such that in addition to the dielectric fill material that is deposited and encapsulates the plates, the spaces can be filled by a stressed nitride film or sidewalls spacers that optionally line the opposing sidewalls of each conductive plate. Furthermore, the film or sidewall spacer on one side of each plate can be thicker than the film or sidewall spacer on the other side.

Lastly, the width of the conductive plates as well as the spacing between adjacent conductive plates at the connecting points (i.e., first spacing), described above, are predetermined based upon current processing techniques for inter-digitated vertical conductive plates. For example, the width of the plates is typically 120-200 nm and the first spacing is typically 80-160 nm). By using the formation method, described below, the second spacing between the main bodies of adjacent conductive plates can be reduced from 80-160 nm to approximately 20 nm. Thus, the structure can be formed such that the width of the conductive plates is approximately 5-10 times greater than spacing between the main bodies of adjacent plates.

Thus, the ratio of the spacing between the main bodies of the conductive plates (i.e., the second spacing) to the width of the plates ranges between approximately 1:5 and 1:10). Consequently, the capacitance density of the capacitor can, depending upon the type of dielectric material used, range from approximately 5-20 fF/$\mu m^2$.

Also, disclosed herein are embodiments of a method of forming the vertical natural capacitor structure, described above. The method comprises forming, above a substrate, a layer comprising a first sacrificial portion and two second portions on opposing sides of the first portion. Then, parallel first and second nodes, that will form the terminals for the capacitor, are formed above the second portions of this layer. As these nodes are formed, multiple vertical conductive plates are also simultaneously formed.

For example, inter-digitated vertical conductive plates can be formed using conventional processing techniques. That is, multiple parallel horizontal electrodes are patterned into successive metal levels such that the horizontal electrodes are aligned, separated by an inter-level dielectric material (e.g., a low k dielectric material (i.e., k<3.9) or an ultra-low k dielectric material (i.e., k<2.2)), and connected by vias.

These conductive plates are formed above the first sacrificial portion of the layer such that the conductive plates are alternately connected at connecting points to either the first node or the second node and such that they are separated by spaces that are filled with a dielectric material.

The conductive plates can further be formed such that they are planar and are perpendicular with respect to both nodes. Alternatively, the conductive plates can be formed with a bend so that they extend outward at an angle from the node to which they are connected and also extend at a desired angle (e.g., perpendicular) to the opposite node. That is, both first and second conductive plates can be simultaneously formed above the sacrificial portion. The first conductive plates can be formed so that they are connected to the first node, so that they extend at a first angle from the first node and so that they comprise a first bend allowing them to further extend perpendicular to the second node. Similarly, second conductive plates can be formed so that they are connected to the second node, so that they extend at a second angle from the second node and so that they comprise a second bend allowing them to further extend perpendicular towards the first node and parallel to the first conductive plates.

Once the plates are formed, the plates remain connected at the connecting points to the nodes, but the size of the spaces between the plates is reduced such that a first spacing between the connecting points of adjacent conductive plates is greater than a second spacing between the main bodies of the adjacent conductive plates.

In order to reduce the size of the spaces, after the conductive plates are formed, the dielectric material from the spaces and as well as the sacrificial portion of the layer below the conductive plates are etched out in separate processes. These etching processes are performed in order to form air gaps in the spaces between the conductive plates and to ensure that the conductive plates are supported only at the connecting points.

As a result of the etching processes, the conductive plates remain connected at the connecting points, but collapse in on the air gaps, thereby, reducing the size of the spaces between the main bodies of the conductive plates. Various alternative techniques may be used to ensure the collapse of the plates. For example, following both etch processes, a wet rinse and dry process can be performed. The surface tension resulting from the rinse causes the conductive plates to collapse in on the air gaps.

Alternatively, after the dielectric material is etched from between the spaces, but before the sacrificial portion is etched, a stressed nitride layer can be deposited at an angle onto the conductive plates such that on each of the conductive plates the stressed nitride layer is thicker on one side. Once the sacrificial portion is released, the thicker stressed nitride on one side causes the conductive plates to collapse in on the air gaps.

Similarly, after the dielectric material is etched from between the spaces, but before the sacrificial portion is etched, sidewall spacers can be formed on the conductive plates and a directional etch process can be performed so that one sidewall spacer is thicker than another sidewall spacer on each of the conductive plates. Once the sacrificial portion is released, the thicker sidewall spacers on one side cause the conductive plates to collapse in on the air gaps.

While the formation of bended plates is optional, such bended plates provide torque to further enhance the collapsing process.

After the size of the spaces has been reduced, another dielectric material (i.e., a second dielectric material) can be deposited over the conductive plates in order to fill any space left between the conductive plates and to encapsulate the conductive plates to ensure that the reduced spacing between the main bodies of adjacent plates is maintained. This second dielectric material can comprise the same or a different dielectric material than the first dielectric material (e.g., the second dielectric material can be a high k dielectric (i.e., k>5.0).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
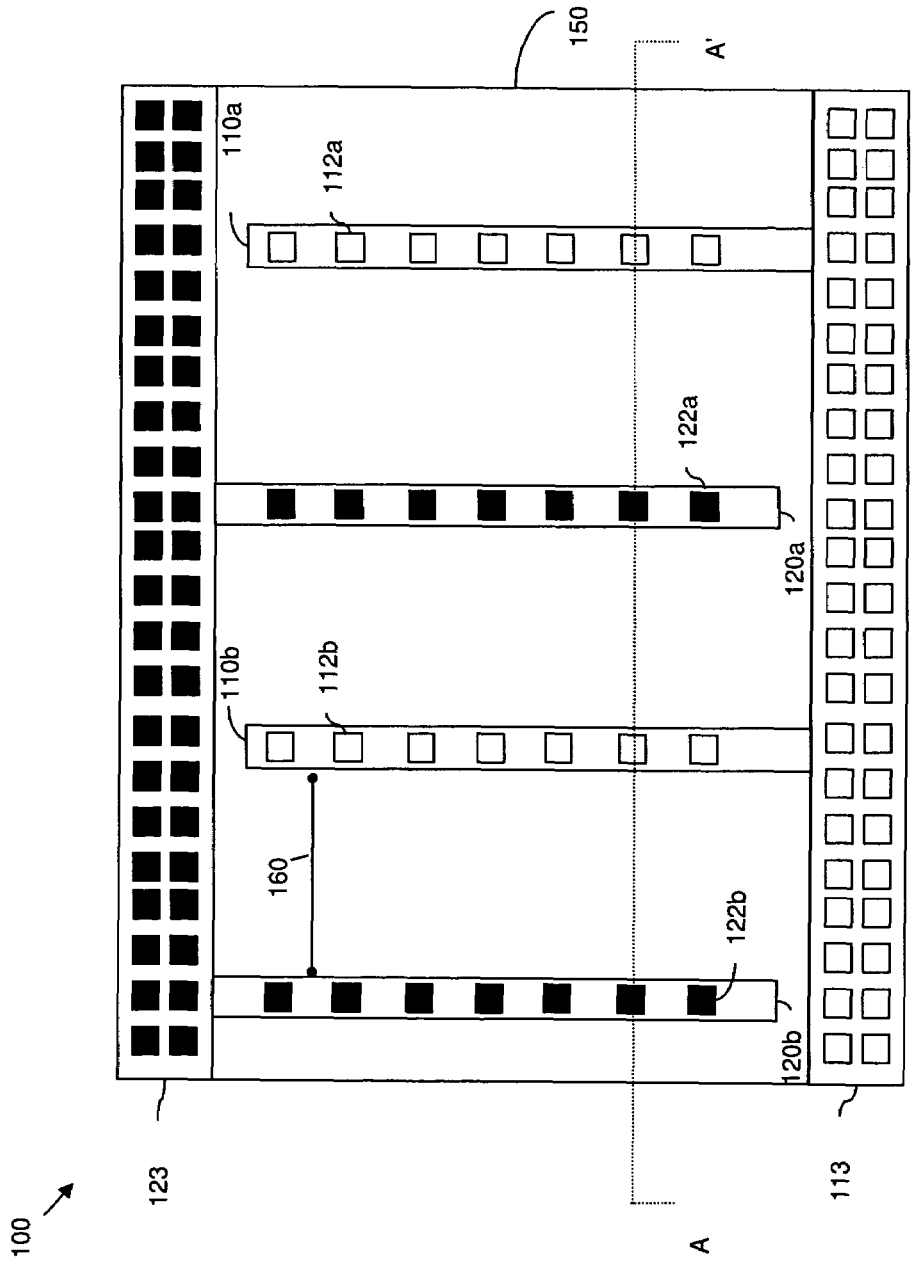
FIG. 1 is a top view diagram illustrating a vertical natural capacitor 100.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 2:
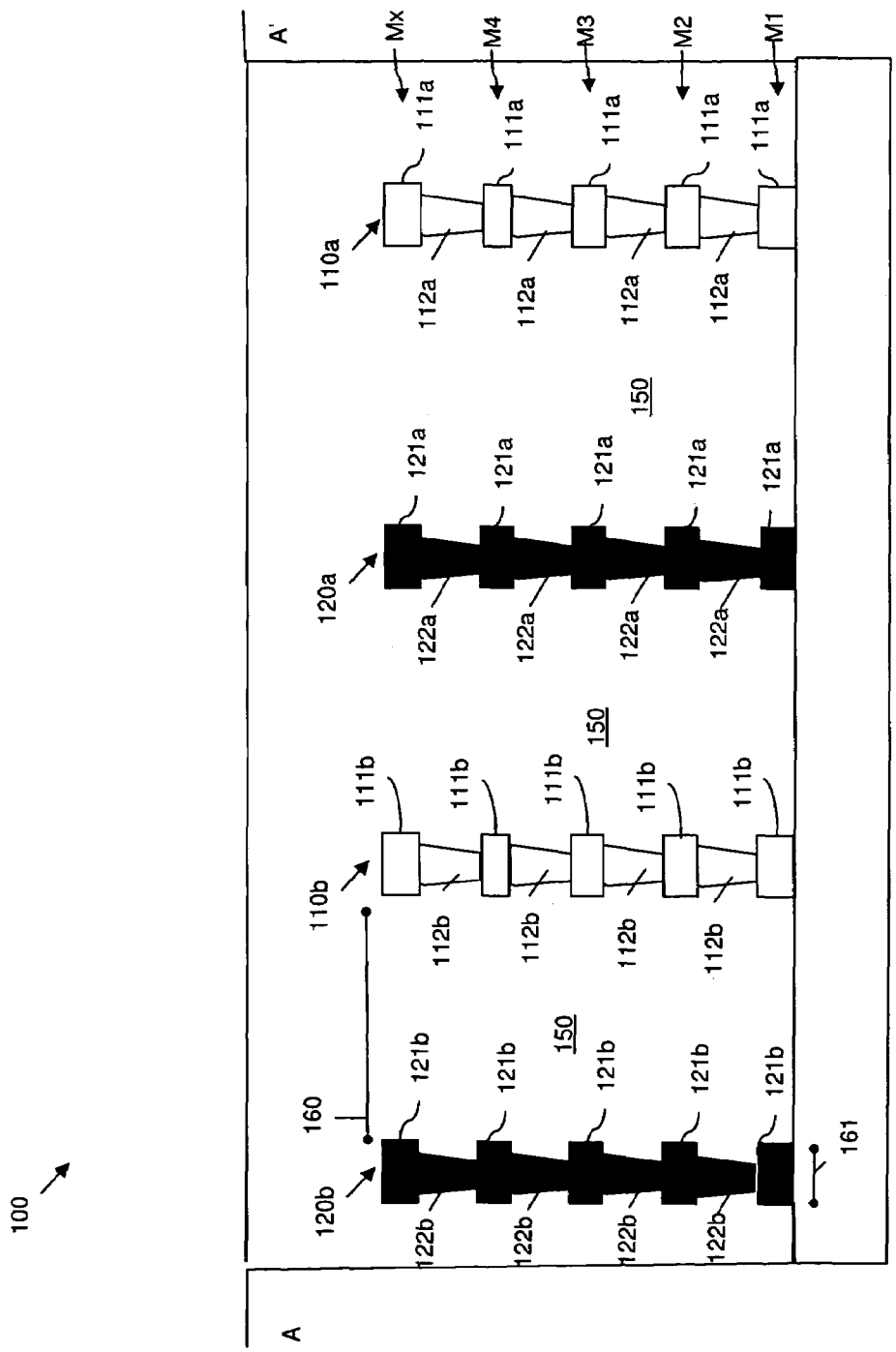
FIG. 2 is a cross-sectional view (A-A') diagram of the capacitor of FIG. 1.

As mentioned above, vertical natural capacitors are currently used as capacitor devices in most of the logic and analog semiconductor technologies. Referring to the top view and cross-section diagrams of FIGS. 1 and 2 in combination, such vertical natural capacitors 100 comprise multiple metal levels (e.g., M1-Mx) separated by an inter-level porous dielectric material 150 with a low dielectric constant (i.e., k<3.9) or ultra low dielectric constant (i.e., k<2.2)). Each metal level M1-Mx comprises a plurality of horizontal first conductive electrodes and a plurality of horizontal second conductive electrodes. Additionally, each horizontal conductive electrode 111a-b and 121a-b is aligned in a stack with the corresponding electrode 111a-b and 121a-b in the adjacent metal level M1-Mx and connected by vias 112a-b and 122a-b, respectively. The stacked horizontal electrodes 111a-b and 121a-b form a parallel array of inter-digitated alternating first vertical conductive plates 110a-b and second vertical conductive plates 120a-b. The first electrical plates 110a-b are connected to a first common node 113 (i.e., a first capacitor terminal) and have a first polarity and the second plates 120a-b are connected to an opposing second common node 123 (i.e., a second capacitor terminal) and have a second polarity.

As technology scaling continues, the capacitance density for such vertical natural capacitors is expected to increase because the vertical plates are expected to be positioned closer and closer. However, due to the introduction of low dielectric constant material (e.g., ultra low k (i.e., k<2.2)) porous material) as the inter-level dielectric, the capacitance density increase of the vertical natural capacitance is expected to drop because the lower the dielectric constant the lower the capacitance and the processing technology for such dialects limits the minimum spacing 160 that can be achieved between the vertical plates 110 and 120. Specifically, with current processing techniques, the minimum width 161 achievable for the horizontal electrodes 111a-b, 121a-b ranges between approximately 120 nm and 200 nm and the minimum spacing 160 between these electrodes ranges between approximately 80 nm and 160 nm. With such dimensions and if a low k inter-dielectric material is used, the capacitance density will range between approximately 1.0 to 1.4 fF/$\mu$m$^2$.

It would be advantageous over the prior art to provide a high capacitance density vertical natural capacitor and a method of forming such a vertical natural capacitor that allows for the incorporation of an inter-level dielectric material with a low or ultra low dielectric constant and still allows for device scaling accompanied by increased capacitance density.

Therefore, disclosed are embodiments of a capacitor with inter-digitated vertical plates and a method of forming the capacitor such that the effective gap distance between plates is reduced. This gap width reduction significantly increases the capacitance density of the capacitor. Gap width reduction is accomplished during back end of the line processing by etching the dielectric material from between the vertical plates and by etching a sacrificial material from below the vertical plates. Etching of the dielectric material from between the plates forms air gaps and various techniques can be used to cause the plates to collapse in on these air gaps, once the sacrificial material is removed. Any remaining air gaps can be filled by depositing a second dielectric material (e.g., a high k dielectric), which will further increase the capacitance density and will encapsulate the capacitor in order to make the reduced distance between the vertical plates permanent.

Figure 3:
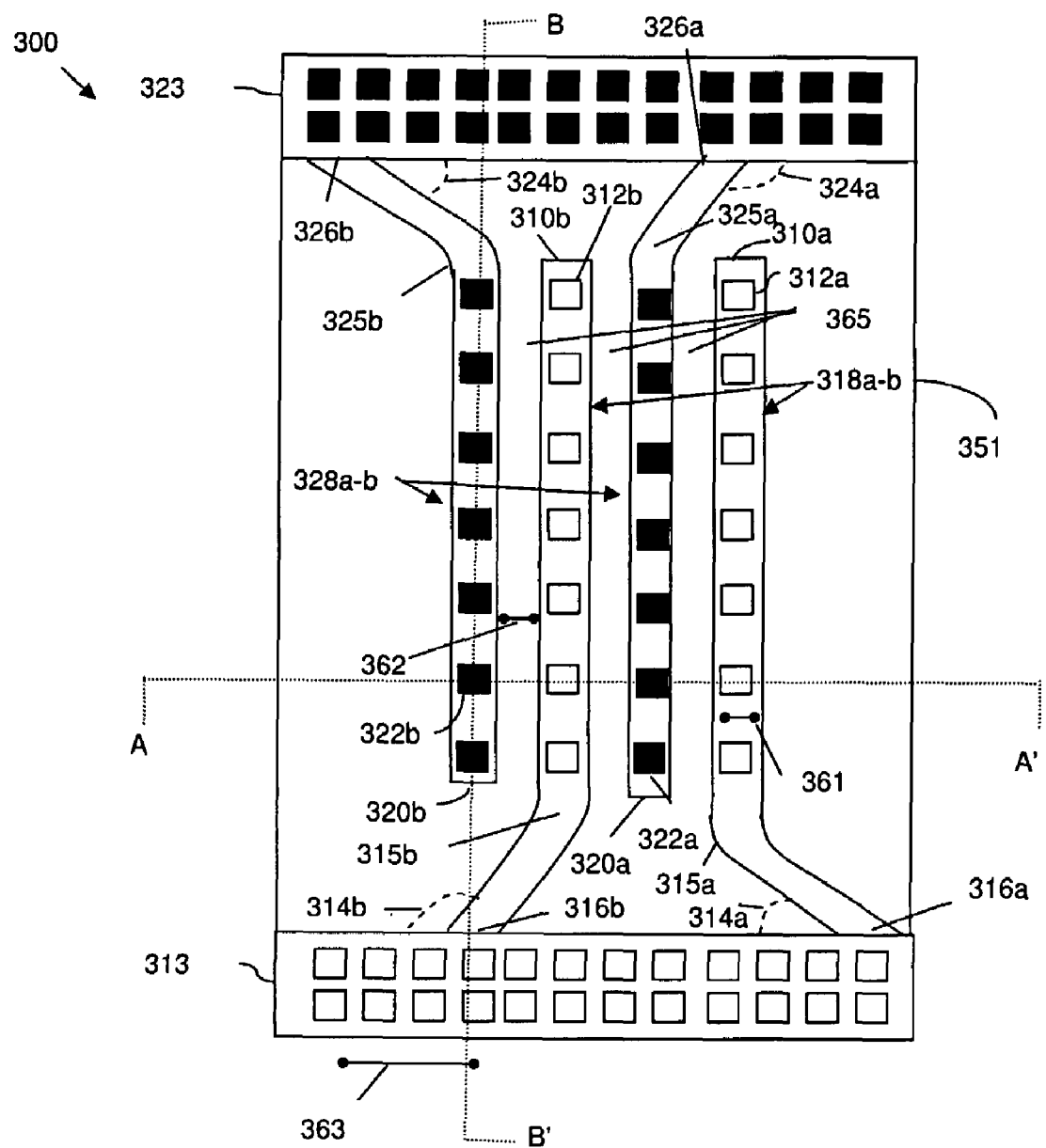
FIG. 3 is a top view diagram illustrating an embodiment of the vertical natural capacitor 300.
Figure 4:
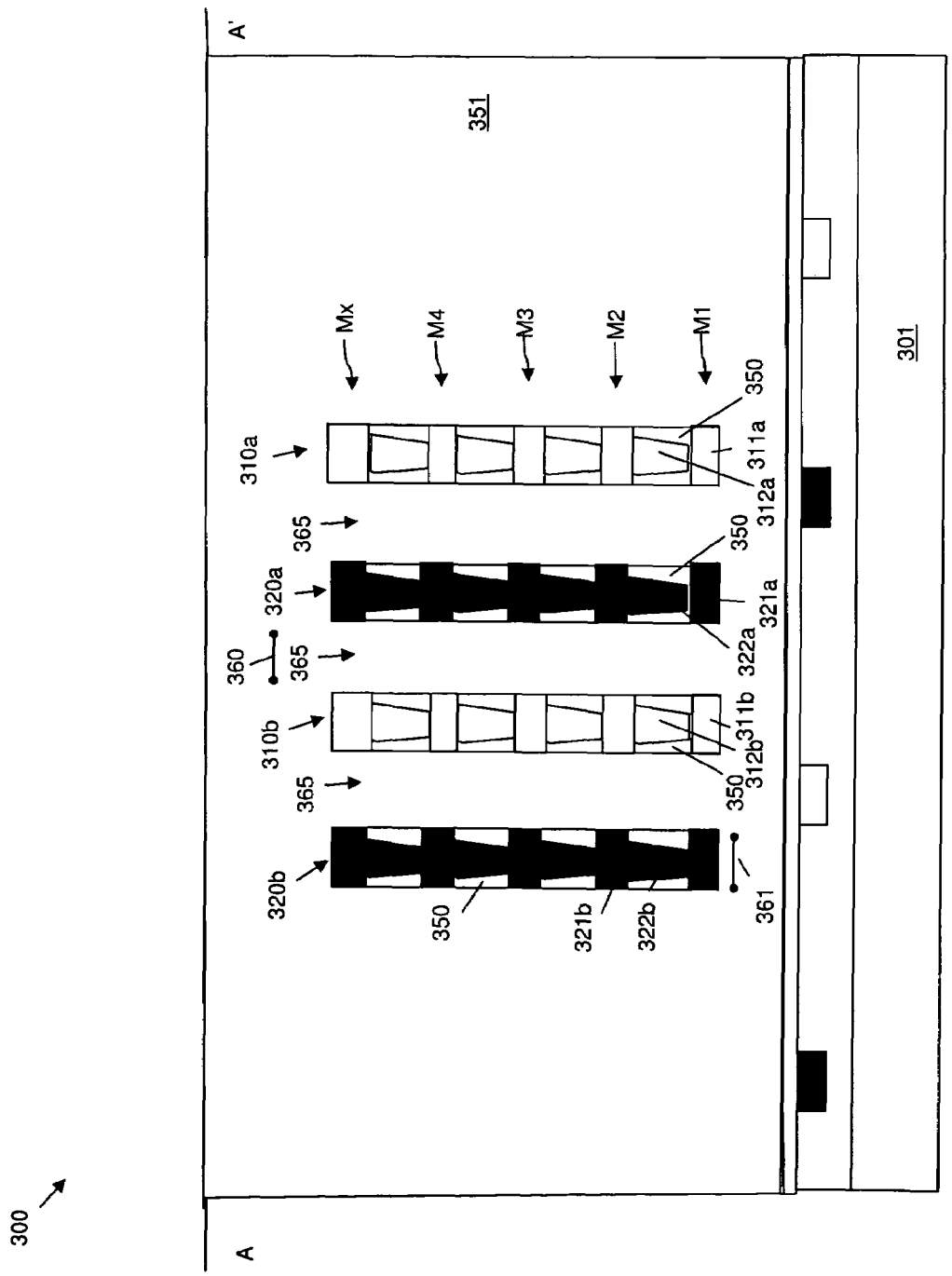
FIG. 4 is a cross-section (A-A') of the capacitor 300 of FIG. 3.
Figure 5:
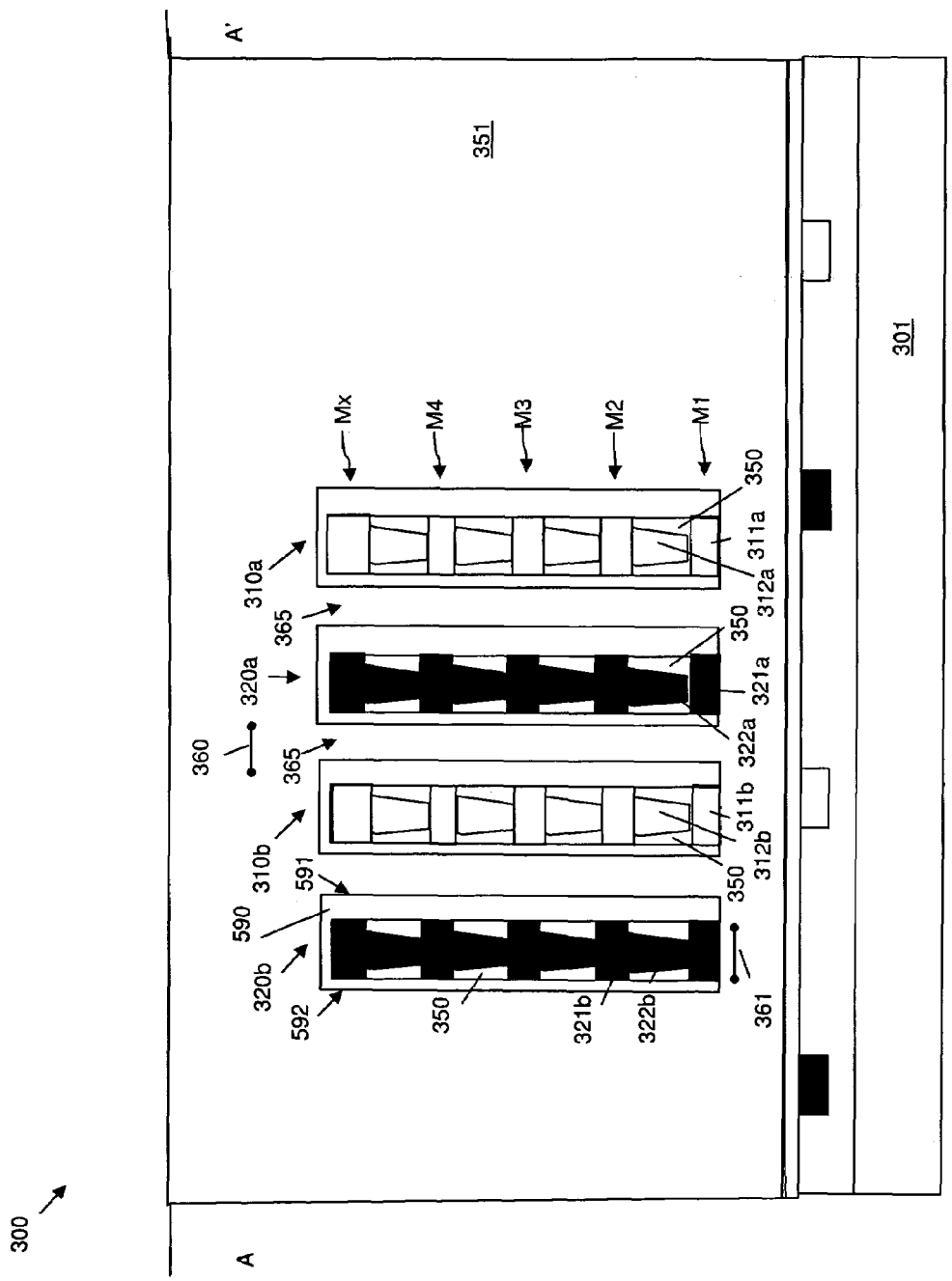
FIG. 5 is an alternative cross-section (A-A') of the capacitor 300 of FIG. 3.
Figure 6:
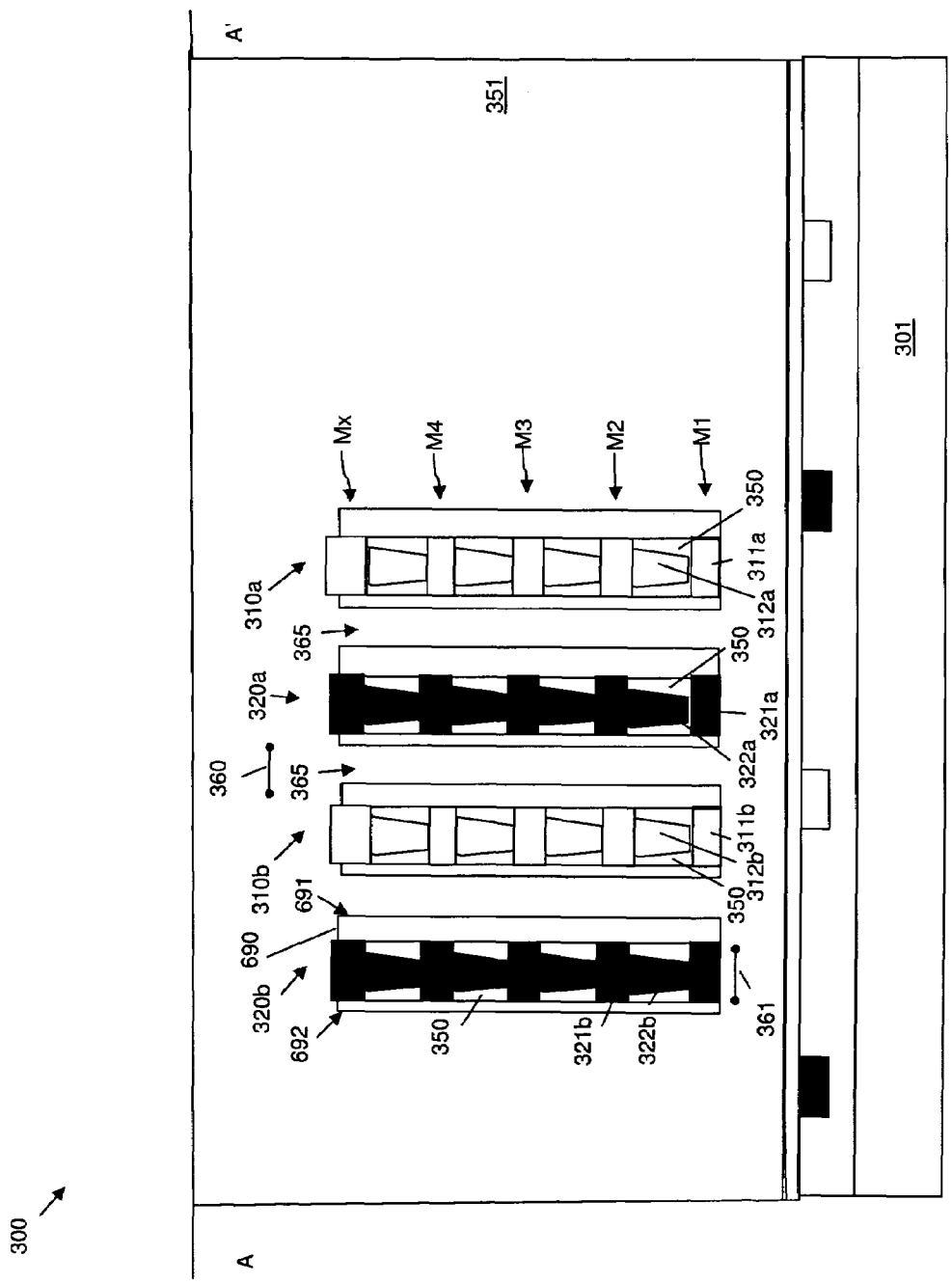
FIG. 6 is another alternative cross-section (A-A') of the capacitor 300 of FIG. 3.

More particularly, referring to FIG. 3, disclosed herein are embodiments of a vertical natural capacitor structure 300. FIGS. 4-6 are cross-sections A-A' of FIG. 3 and illustrate additional features which may alternatively be incorporated into the embodiment of FIG. 3.

Referring to FIG. 3, the capacitor structure 300, can comprise two parallel nodes 313, 323 with opposite polarity on a substrate (i.e., a first node 313 with a first polarity (e.g., positive) and a second node 323 with a second polarity (e.g., negative)). These nodes 313, 323 form the terminals of the capacitor.

The structure 300 also comprises a plurality of vertical conductive plates 310a-b, 320a-b that are separated by spaces 365. Although, as illustrated in FIGS. 3-6, the capacitor comprises four plates, it is anticipated that the capacitor 300 of the invention may comprise more or less plates. The plates 310a-b, 320a-b are positioned above the substrate and extend between the two nodes 313, 323.

More particularly, the plates 310a-b, 320a-b can extend vertically from the substrate 301. The plates 310a-b, 320a-b can be alternately electrically connected to either the first node 313 or the second node 323 at connecting points 316a-b, 326a-b. For example, first conductive plates 310a-b can be electrically connected at one end (see connecting points 316a-b) to the first node 313 and positioned adjacent to second conductive plates 320a-b that are electrically connected at an opposite end (see connecting points 326a-b) to the second node 323. Each of the conductive plates 310a-b, 320a-b further comprises a main body 318a-b, 328a-b that is approximately planar, approximately parallel to the main body of any adjacent conductive plates and approximately perpendicular to the first and second nodes 313, 323.

Additionally, a first spacing 363 between the connecting points of any adjacent conductive plates (e.g., between connecting point 326b of plate 320b and connecting point 316b of plate 310b) is greater than a second spacing between the main bodies of any adjacent plates (e.g., between plate 320b and plate 310b). More specifically, at least some of the conductive plates extend outward at an angle from that node to which they are connected and comprise a curve that is angled towards the opposite node. The angle varies from plate to plate so that the spacing between the main bodies 318a-b, 328a-b of adjacent plates is reduced.

For example, referring to FIG. 3, the first conductive plates 310a-b extend outward from the first node 313 at different first angles 314a-b and comprise first curves 315a-b that are angled toward the second node 323. The main bodies 318a-b of the first conductive plates 310a-b extend from the first curves 315a-b towards the second node 323. Similarly, the second conductive plates 320a-b extend outward from the second node at different second angles 324a-b and comprise second curves 325a-b that are angled towards the first node 313. The main bodies 328a-b of the second conductive plates 320a-b extend from the second curves 325a-b towards the first node 313. Thus, the main bodies of the first and second conductive plates 310a-b, 320a-b are approximately parallel and perpendicular to the nodes 313, 323.

Referring to FIG. 4, the conductive plates 310a-b, 320a-b can be inter-digitated. Specifically, each plate 310a-b, 320a-b can comprise a horizontal electrode (e.g., 311a-b, 321a-b) on each of a plurality of metal levels (e.g., M1-Mx). Thus, each metal level M1-Mx comprises a plurality of horizontal first conductive electrodes 311a-b and a plurality of horizontal second conductive electrodes 321a-b. The first and second conductive electrodes 311a-b, 321a-b on each metal level M1-Mx are separated and alternately connected to the first and second nodes 313, 323, respectively (see FIGS. 3 and 4). Thus, each first conductive electrode 311a-b has a first polarity (e.g., is a positive electrode) and each second conductive electrode 321a-b has a second polarity (e.g., is a negative electrode).

Additionally, each horizontal conductive electrode on each metal level is aligned in a stack with a corresponding electrode in the adjacent metal levels. The aligned horizontal electrodes are separated by an inter-level dielectric material 350 (i.e., a first dielectric material). This first dielectric material can, for example, comprise a low dielectric constant (i.e., k<3.9) or even an ultra low k (i.e., k<2.2) material. Each aligned horizontal electrode in a stack is further connected to the adjacent electrodes above and below by vias 312a-b, 322a-b within the inter-level dielectric 350. Thus, the stacked electrodes form a parallel array of inter-digitated vertical plates that have alternating polarity and are separated by spaces 365.

The spaces 365 between the conductive plates 310a-b, 320a-b can be filled with a dielectric material 351 (i.e., a second dielectric material) that is the same or different from the inter-level dielectric material. For example, this second dielectric material can comprise a high k dielectric material (i.e., k>5.0). This second dielectric material 351 can further encapsulate the conductive plates 310a-b, 320a-b so that the relative spacing between the plates is maintained.

The structure 300 can also be formed so that in addition to the dielectric fill material 351 that is deposited and encapsulates the plates 310a-b, 320a-b, the spaces 365 can be filled by a stressed nitride film 590 (as illustrated in FIG. 5) or sidewalls spacers 690 (as illustrated in FIG. 6) that optionally line the opposing sidewalls of each conductive plate. Furthermore, the film 590 or sidewall spacer 690 can be thicker on one side 591, 691 of each plate than the other side 592, 692.

Although the illustrations of FIGS. 5 and 6 show the thicker film layer/sidewall spacers on the same side of each plate, it is anticipated that for half of the conductive plates (e.g., plates 310a and 320a) the thicker stressed film layer/sidewall spacer could be positioned on one side and for the other half of the conductive plates (e.g., plates 310b and 320b) the thicker stressed film layer/sidewall spacer could be positioned on the opposite side. During formation, discussed below, the thicker stressed film layer/sidewall spacer causes the conductive plates to collapse in on air gaps between the plates and, thereby, reduces the spacing (i.e., the second spacing) between the main bodies 318a-b, 328a-b of the conductive plates 310a-b, 320a-b. If the thicker stressed film layer/sidewall spacer is on the same side of all of the plates, the plates will tend to collapse towards one end of the structure. If the plates on half of the structure have the thicker stressed film/sidewall spacer on one side and the plates on the other half of the structure have the thicker stressed film/sidewall spacer on the opposite side, the collapse of the plates can be directed towards the center.

Lastly, the conductive plates 310a-b, 320a-b, described above, have a predetermined width 361. This predetermined width 361 as well as the first spacing 363 between the connecting points of adjacent conductive plates, discussed above, are determined based on processing techniques used to form inter-digitated vertical conductive plates. For example, using the conventional processing techniques, discussed above, the first width typically ranges between approximately 120 nm and 200 nm and the spacing between the connecting points of adjacent conductive plates typically ranges between 80 nm and 160 nm.

By using the formation method of the invention, described below, the second spacing 362 between the main bodies 318a-b, 328a-b of adjacent conductive plates can be reduced from 80-160 nm to approximately 20 nm. Thus, the structure 300 can be formed such that the width 361 of the conductive plates (e.g., 120-200 nm) is approximately 5-10 times greater than the spacing 362 (e.g., 20 nm) between the main bodies 318a-b, 328a-b of adjacent plates.

Consequently, the capacitance density is scalable and can, depending upon the type of dielectric material 350, 351 used (greater k results in higher capacitance density), range from approximately 5-20 fF/$\mu$m$^2$. Thus, the capacitance density achievable with the structure 300 is significantly greater than the capacitance density of approximately 1.0 to 1.4 fF/$\mu$m$^2$ achievable with prior art vertical natural capacitor structures.

Figure 7:
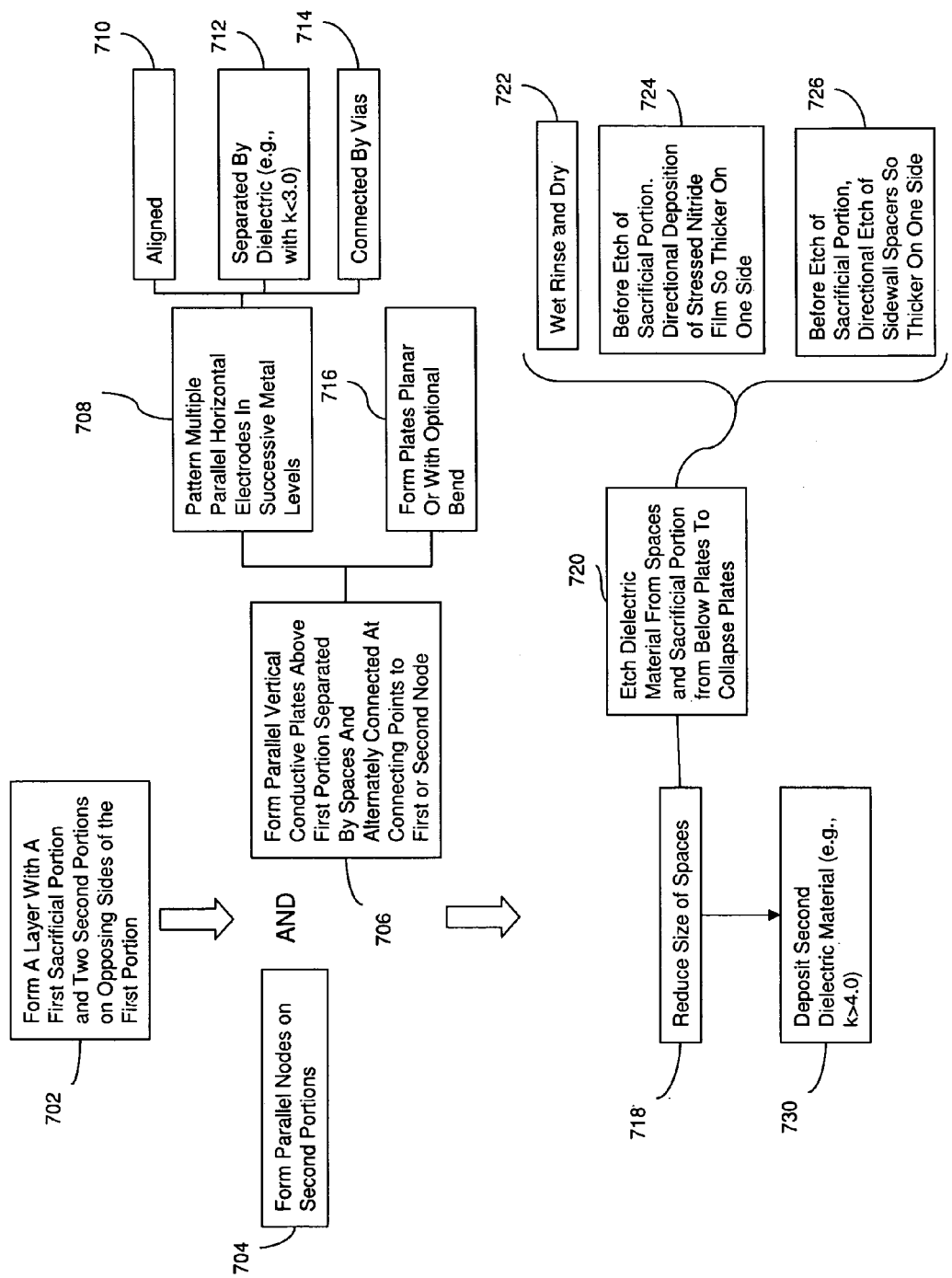
FIG. 7 is a flow diagram illustrating embodiments of the method of forming the capacitor structure 300 of FIG. 3.
Figure 8:
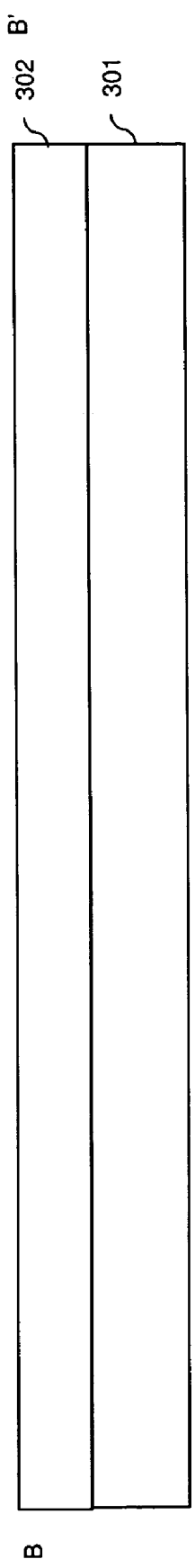
FIG. 8 is a cross-section (B-B') of a partially completed capacitor 300 of FIG. 3.
Figure 9:
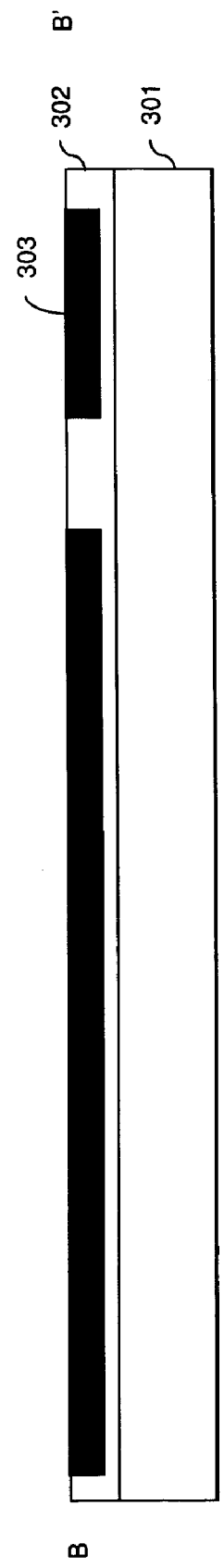
FIG. 9 is a cross-section (B-B') of a partially completed capacitor 300 of FIG. 3.

Referring to FIG. 7, also disclosed herein are embodiments of a method of forming the vertical natural capacitor structure 300 of FIG. 3, described above. The embodiments of the method begin by forming a dielectric layer 302 (e.g., SiO$_2$) on a substrate 301 (see FIG. 8). The dielectric layer 302 is etched with a pattern corresponding to horizontal electrodes and nodes for the vertical capacitor. Then, a metal 303 (e.g., copper (Cu)) is deposited and planarized (see FIG. 9). One or more additional protective dielectric layers can be deposited above the metal layer 303.

Figure 10:
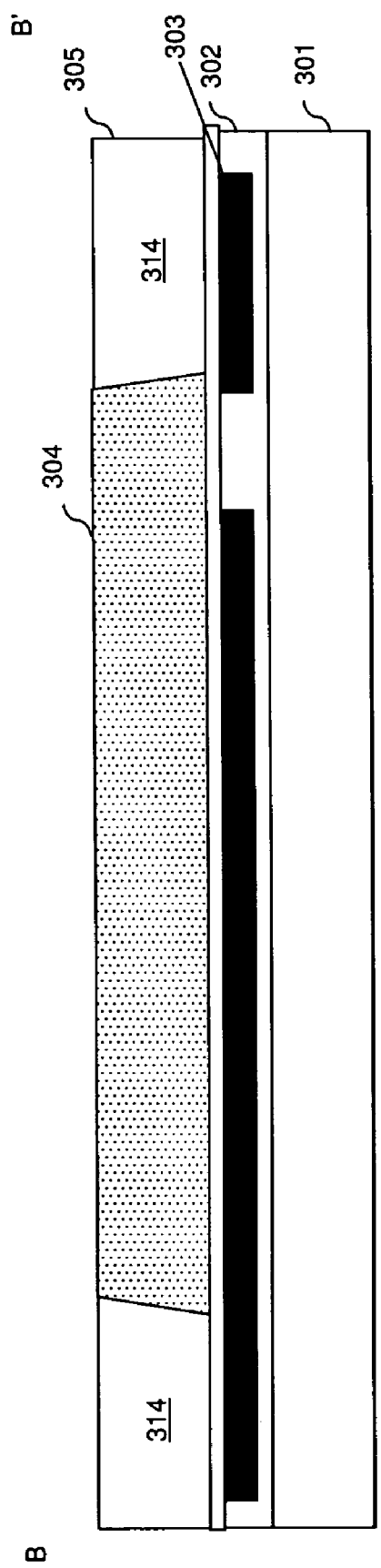
FIG. 10 is a cross-section (B-B') of a partially completed capacitor 300 of FIG. 3.

Then, a layer 305 comprising a first sacrificial portion 304 and two second portions 314 on opposing sides of the first portion 304 can be formed (702, see FIG. 10). This process 702 can be accomplished by depositing, patterning and etching a sacrificial layer (e.g., SiLK™ by the Dow Chemical Company). Then, inter-level dielectric material 350 (e.g., a low k dielectric material (i.e., k<3.9 or an ultra-low k dielectric material (i.e., k<2.2)) can then be deposited over the remaining portion of the sacrificial layer and planarized level with the sacrificial layer, thereby, forming the layer 305 with the first sacrificial portion 304 bordered by second portions 314. Alternatively, this process 702 can be accomplished by depositing an inter-level dielectric material 350. The inter-level dielectric 350 can then be patterned and etched with a cavity. A sacrificial layer (e.g., SiLK™ of the Dow Chemical Company) can be deposited into the cavity and planarized level with the inter-level dielectric 350, thereby, forming the layer 305 with the first sacrificial portion 304 bordered by second portions 314.

Figure 11A:
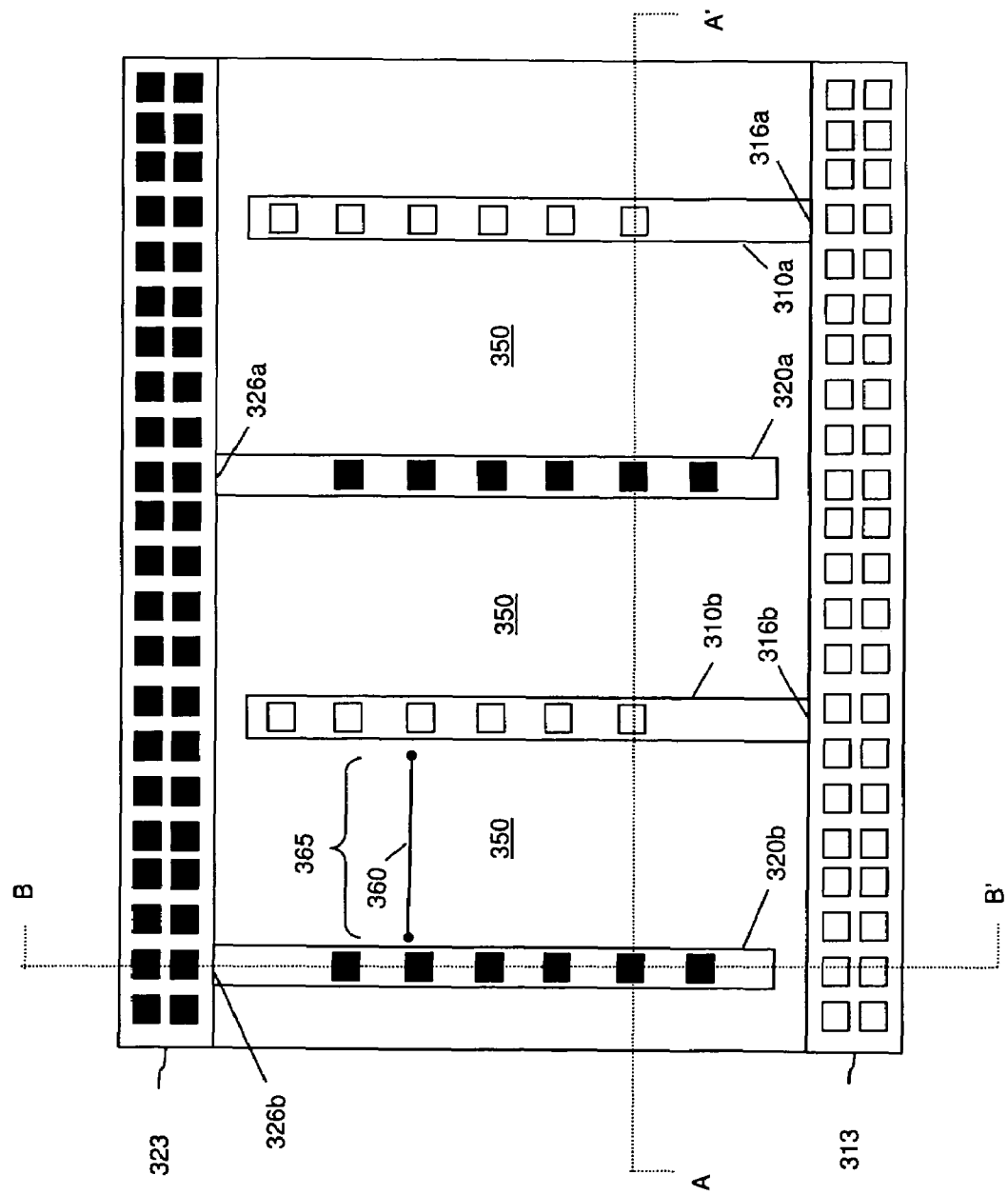
FIG. 11a is a top view diagram of an exemplary partially completed capacitor 300 of FIG. 3.
Figure 11B:
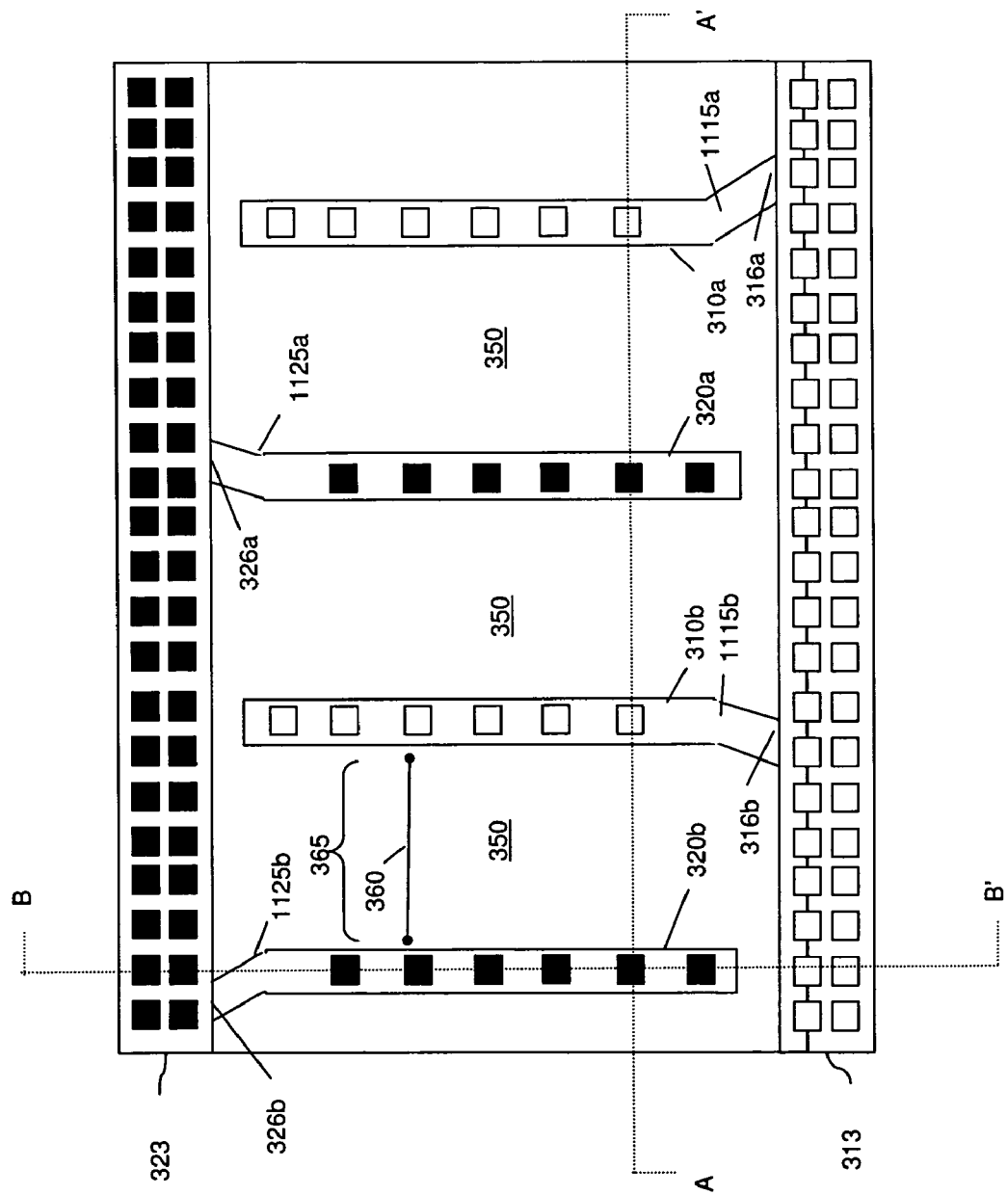
FIG. 11b is a top view diagram of an exemplary partially completed capacitor 300 of FIG. 3.
Figure 12:
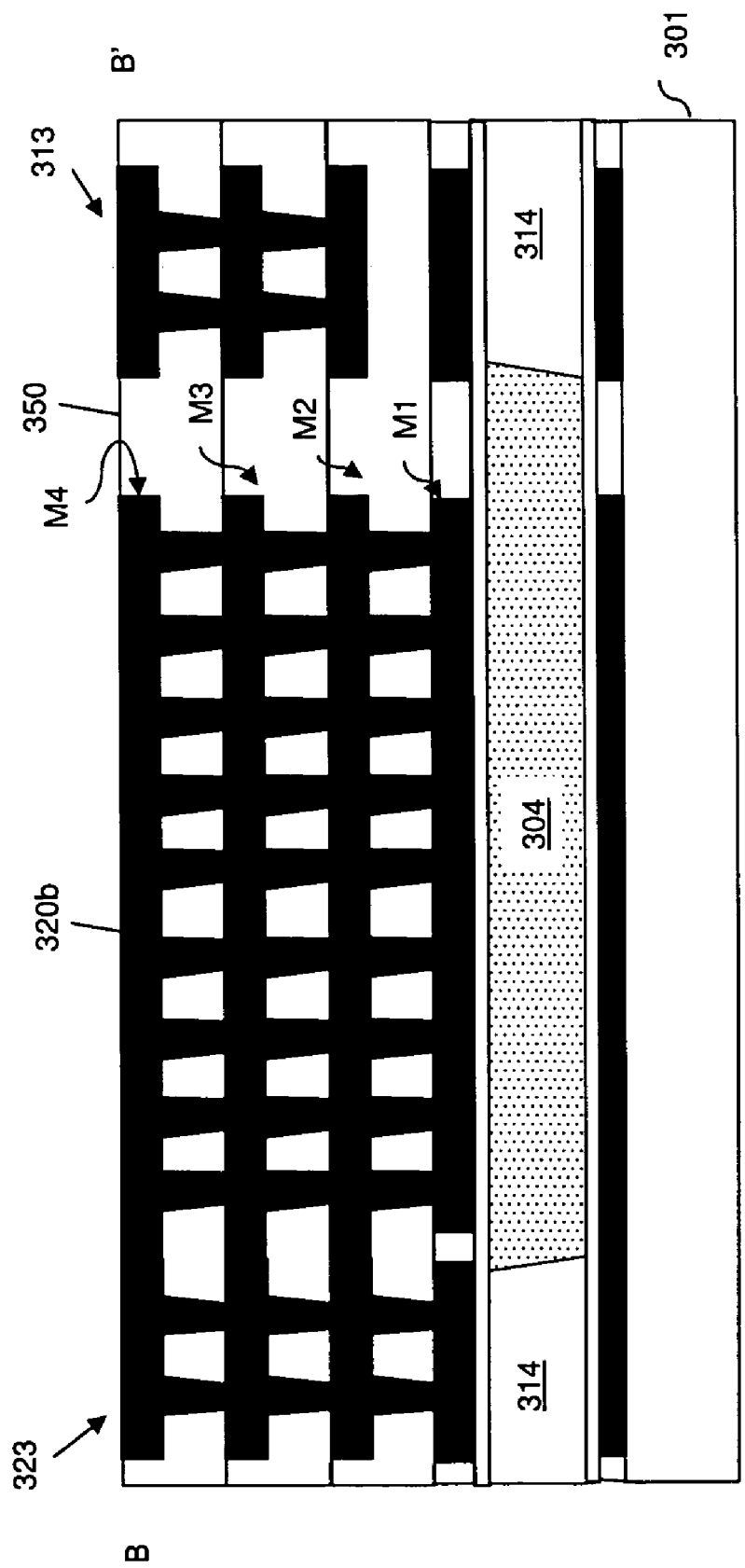
FIG. 12 is a cross-section (B-B') of a partially completed capacitor 300 of FIG. 3.

After the formation of layer 305, standard wiring levels are used to fabricate the capacitor 300. Referring to FIGS. 10 and 11a or 11b in combination, inter-digitated vertical conductive plates 310a-b, 320a-b and terminal nodes 313, 323 are simultaneously formed above the first 304 and second portions 314, respectively, of layer 305, using conventional processing techniques (e.g., a dual-damascene scheme or as described in U.S. Pat. No. 6,822,312 issued to Sowlati et al. on Nov. 23, 2004 and incorporated herein by reference) (704-706). As mentioned above, by using such conventional processing techniques, plates 310a-b, 320a-b that have a width of approximately 120-200 nm and that are separated by a spaces that are approximately 80-160 nm can be formed.

Specifically, each plate 310a-b, 320a-b can be formed to have a horizontal electrode (e.g., 311a-b, 321a-b) in each of a plurality of successive metal levels (e.g., M1-Mx) (708). Thus, each metal level M1-Mx can be formed to comprise a plurality of horizontal first conductive electrodes 311a-b and a plurality of horizontal second conductive electrodes 321a-b. These horizontal electrodes 311a-b, 321a-b can be patterned such that they are separated by spaces 365 having, for example, a width 360 (e.g., a minimum width achievable using lithographic techniques). The first and second conductive electrodes 311a-b, 321a-b on each metal level M1-Mx can further be patterned such that they are alternately connected at to the first and second nodes 313, 323 at connecting points 316a-b, 326a-b. Thus, each first conductive electrode 311a-b will have a first polarity (e.g., is a positive electrode) and each second conductive electrode 321a-b will have a second polarity (e.g., is a negative electrode).

Additionally, each horizontal conductive electrode in each metal level M1-Mx can be patterned so that they are aligned (710) in a stack with a corresponding electrode in the adjacent metal level M1-Mx. The horizontal electrodes on and between each metal level are separated during processing by multiple depositions of an inter-level dielectric material 350 (i.e., a first dielectric material) (712). This first dielectric material can, for example, comprise a low dielectric constant (i.e., k<3.9) or even an ultra low k (i.e., k<2.2) material. However, each aligned horizontal electrode in a stack is further connected to the adjacent horizontal electrodes above and below by the formation of vias within the inter-level dielectric 350 (714). Thus, a parallel array of inter-digitated vertical plates 310a-b, 320a-b that are separated by dielectric 350 filled spaces 365 and that have alternating polarity is formed.

Furthermore, these conductive plates can be formed at process 706 planar (see FIG. 1a) or with optional bends (see FIG. 11b) (716). Specifically, referring to FIG. 11a, the plates 310a-b and 320a-b can be formed such that they are planar and are perpendicular with respect to both nodes 313 and 323. Alternatively, referring to FIG. 11b, the conductive plates 310a-b and 320a-b can each be formed with a bend so that they extend outward at an angle from the node to which they are connected and also extend at a desired angle (e.g., perpendicular) to the opposite node. For example, the process of forming the conductive plates can comprise simultaneously forming both first and second conductive plates 310a-b, 320a-b. The first conductive plates 310a and b can be formed so that they are connected to the first node 313 at connecting points 316a-b, so that they extend at an angle from the first node 313 and so that they comprise a first bend (e.g., see bends 1115a of plate 310a and 1115b of plate 310b) allowing them to further extend perpendicular to the second node 323.

Similarly, second conductive plates 320a and b can be formed so that they are connected to the second node 323 at connecting points 326a-b, so that they extend at an angle from the second node and so that they comprise a second bend (e.g., see bends 1125a of plate 320a and 1125b of plate 320b) allowing them to further extend perpendicular towards the first node 313. Thus, for the most part the first conductive plates 310a-b and the second conductive plates 320a-b are formed parallel to each other.

Figure 13:
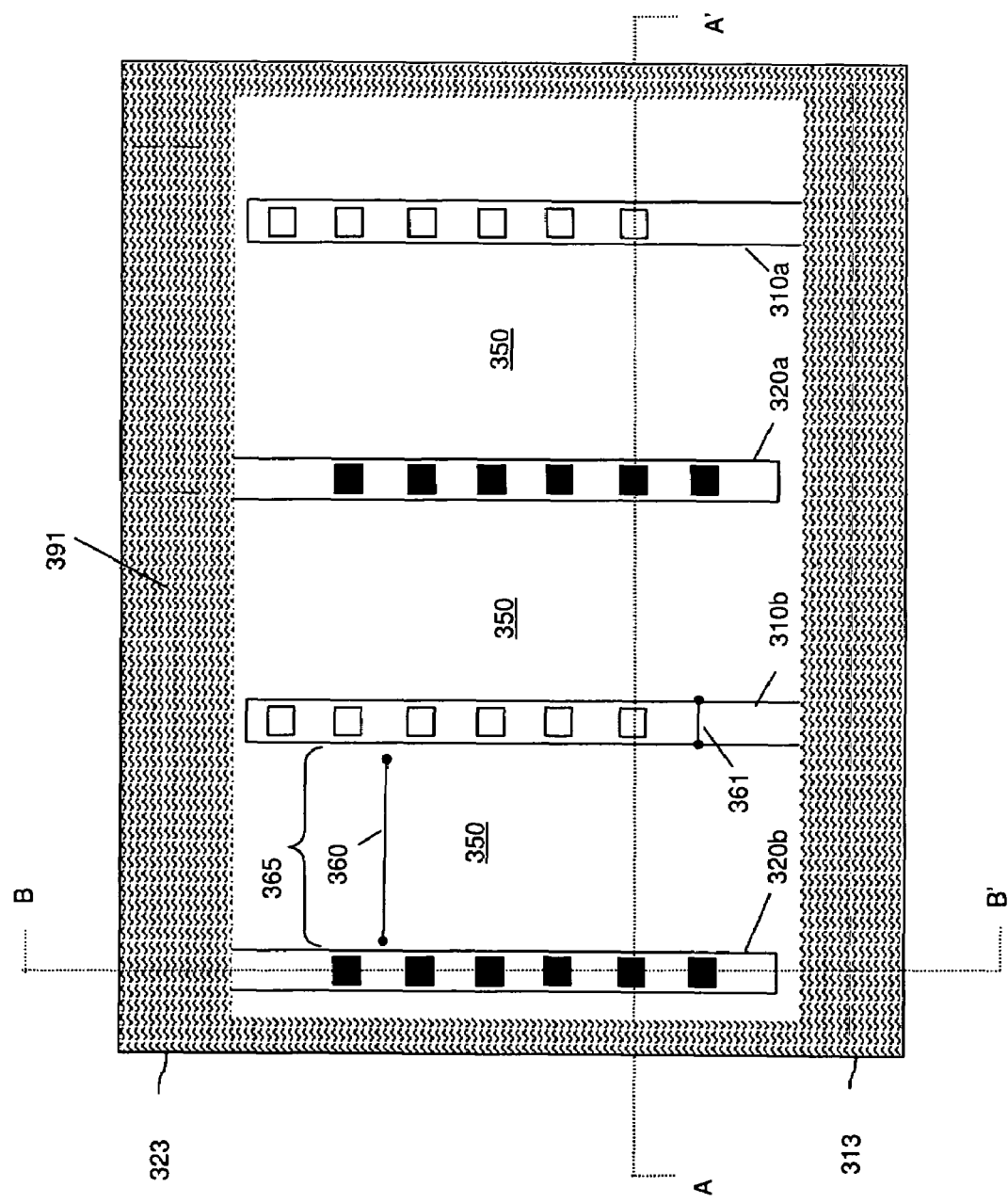
FIG. 13 is a top view diagram of an exemplary partially completed capacitor 300 of FIG. 3.
Figure 14:
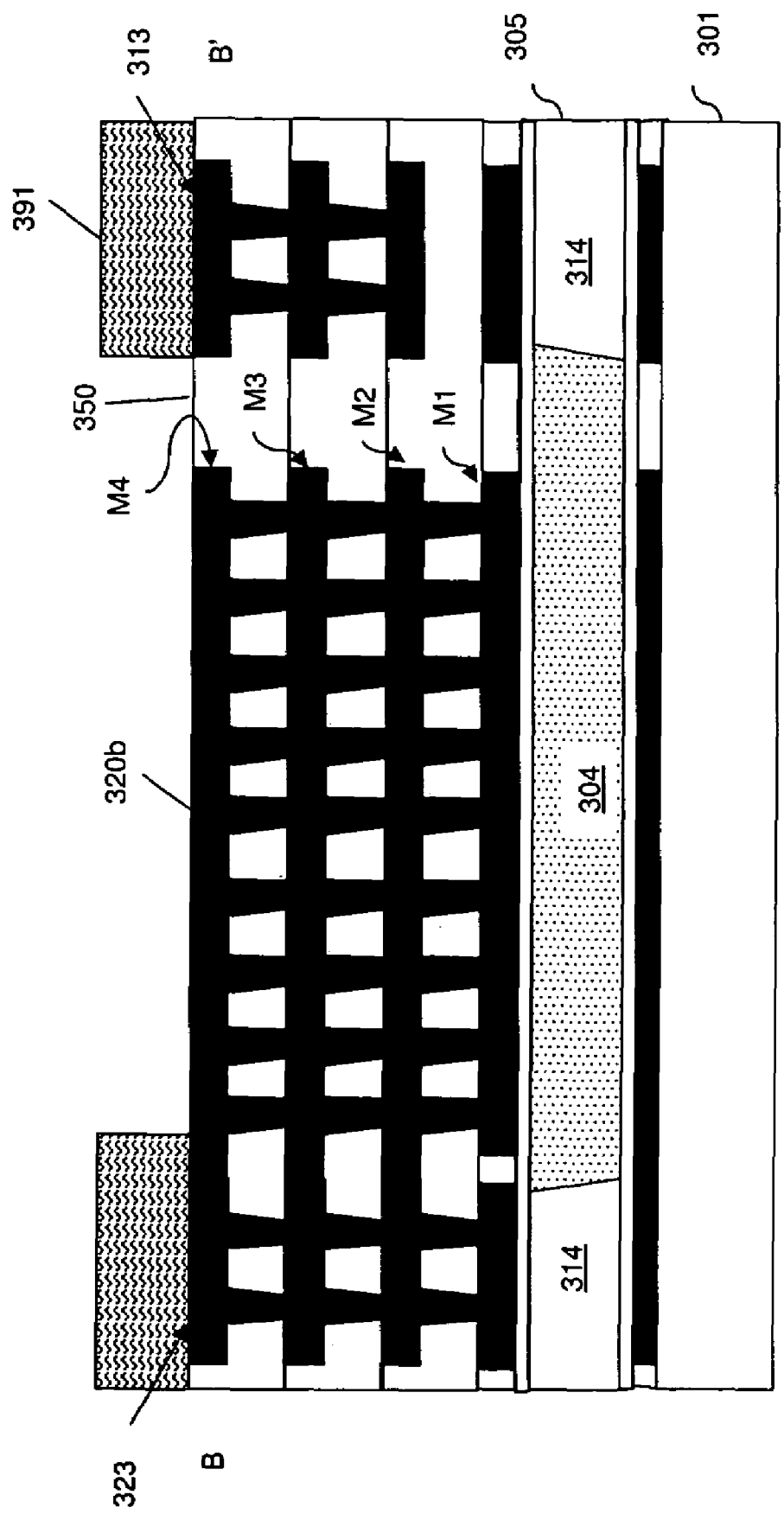
FIG. 14 is a cross-section (B-B') of a partially completed capacitor 300 of FIG. 3.

Upon completion of 706, a release mask 391 patterned such that the conductive plates 310a-b, 320a-b are exposed and the nodes 313, 323 are masked (see FIGS. 13 and 14). Then, the size of the spaces between the plates is reduced (718). Specifically, mask protects the connecting points 316a-b, 326a-b such that the plates 310a-b, 320a-b remain to the nodes, but the size of the spaces 365 between the plates is reduced such that a first spacing 363 between adjacent connecting points is greater than a second spacing 362 between main bodies of adjacent conductive plates. For example, as illustrated in FIG. 3, the spaces 365 are reduced so that the spacing 361 between connecting points 326b and 316b is greater than the spacing 362 between the main body 328b and the main body 318b of adjacent plates 320b and 310b.

Figure 15:
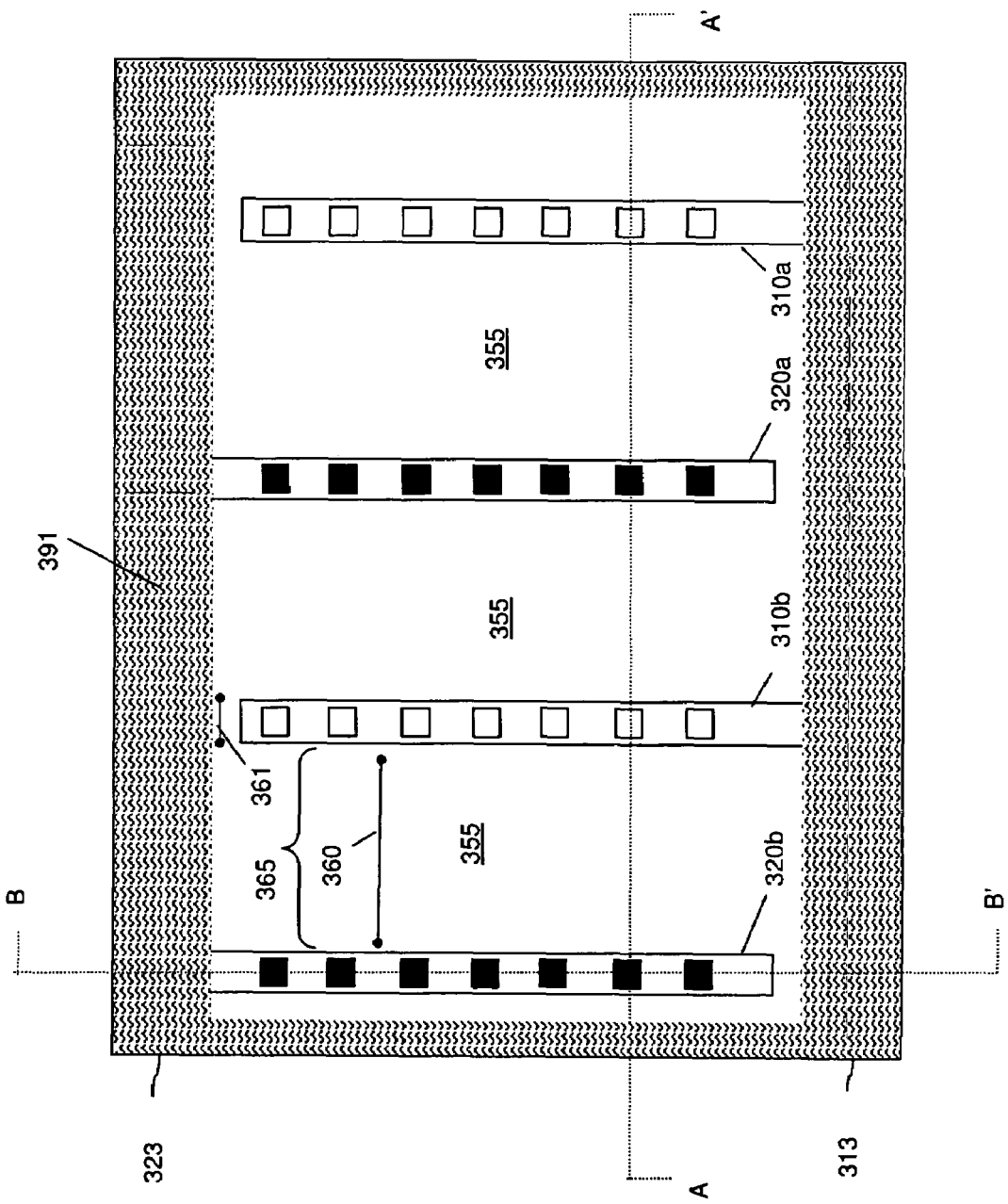
FIG. 15 is a top view diagram of an exemplary partially completed capacitor 300 of FIG. 3.
Figure 16:
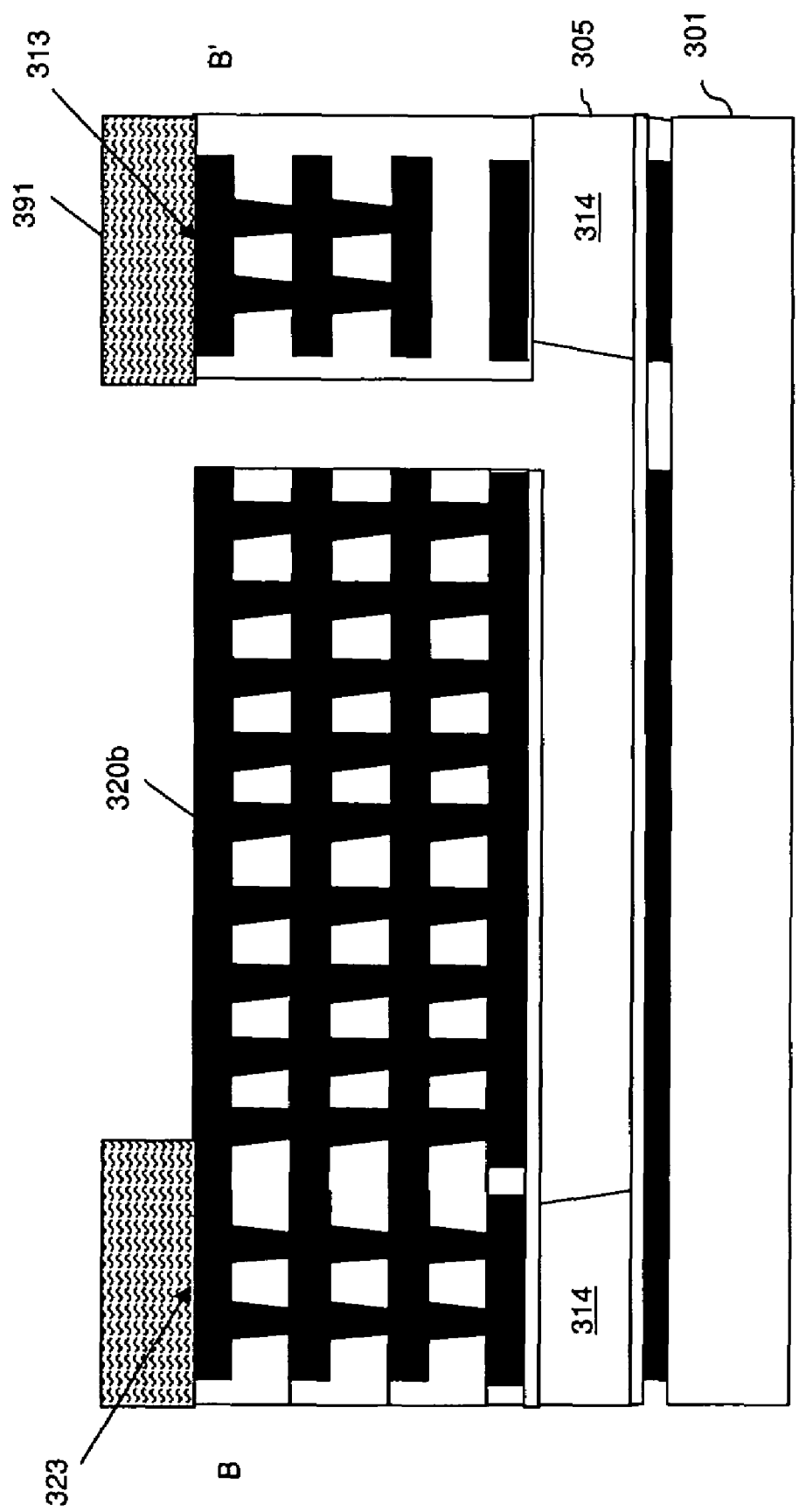
FIG. 16 is a cross-section (B-B') of a partially completed capacitor 300 of FIG. 3.

In order to reduce the size of the spaces 365 after the conductive plates are formed, both the dielectric material 350 from the spaces 365 and the sacrificial portion 304 of the layer 305 below the conductive plates 310a-b, 320a-b are etched out in separate selective etch processes (720, see FIGS. 15-16). These etching processes are performed in order to form air gaps 355 in the spaces 365 between the conductive plates 310a-b, 320a-b. The release mask 391 ensures that the conductive plates 310a-b, 320a-b remain connected and supported only at the connecting points 316a-b, 326a-b.

As a result of the etching processes (720), the conductive plates 310a-b, 320a-b collapse in on the air gaps 355. That is, the main bodies 318a-b, 328a-b of the plates 310a-b, 320a-b move closer together and, thus, the plates bend near the connecting points. Consequently, the spacing between connecting points of adjacent plates (i.e., the first spacing 363) remains the same (e.g., between 80-160 nm), while the spacing between the main bodies of the conductive plates is significantly reduced (e.g., to approximately 20 nm). Thus, the structure 300 can be formed such that the width 361 of the conductive plates (e.g., 120-200 nm) is approximately 5-10 times greater than the spacing 362 (e.g., 20 nm) between the main bodies 318a-b, 328a-b of adjacent plates.

Consequently, the achievable capacitance density using the method described herein, depending upon the type of dielectric material 350, 351 used (greater k results in higher capacitance density), range from approximately 5-20 fF/$\mu$m$^2$, which is significantly greater than the capacitance density of approximately 1.0 to 1.4 fF/$\mu$m$^2$ achievable with prior art methods of forming vertical natural capacitors.

After the size of the spaces 365 between the plates has been reduced at process 718, another dielectric material 351 (i.e., a second dielectric material) can be deposited over the conductive plates 310a-b, 320a-b in order to fill any air gaps 355 left between the conductive plates and to encapsulate the conductive plates to ensure that the reduced spacing is maintained (730). This second dielectric material 351 can, for example, comprise dielectric material with a high dielectric constant (i.e., k>5.0).

Various alternative techniques may be used to ensure the collapse of the plates at process 720. For example, following both etch processes, a wet rinse (e.g., water rinse, HF rinse, etc.) and dry (e.g., a supercritical CO$_2$ dry) process can be performed (722). Surface tension resulting from the rinse causes the conductive plates to collapse in on the air gaps (see FIG. 4).

More specifically, referring to FIG. 3, after the rinse, the plates 310a-b, 320a-b will remain electrically connected to the first or second nodes 313, 323 at the connecting points 316a-b, 326a-b. However, surface tension causes the plates 310a-b, 320a-b to move closer together. As the plates move closer together, the portion of each plate adjacent to a node will bend, but the main body 318a-b, 328a-b of each plate will remain approximately planar and perpendicular to the opposite node.

Alternatively, after the dielectric material is etched from between the spaces, but before the sacrificial portion is etched, a stressed nitride layer 590 can be deposited at an angle onto the conductive plates such that on each of the conductive plates the stressed nitride layer is thicker on one side (e.g., side 591) (724). Once the sacrificial portion is released, the thicker stressed nitride on one side causes a stress gradient in the conductive plates, thereby, causing them to collapse in on the air gaps (see FIG. 5). Similarly, after the dielectric material is etched from between the spaces, but before the sacrificial portion is etched, sidewall spacers 690 can be formed on the conductive plates and a directional etch process can be performed so that one sidewall spacer is thicker than another sidewall spacer on each of the conductive plates (726). Once the sacrificial portion is released, the thicker sidewall spacers on one side (e.g., side 691) cause the conductive plates to collapse in on the air gaps (see FIG. 6).

More specifically, after the etch processes, the plates 310a-b, 320a-b will remain electrically connected to either the first or second nodes 313, 323 at the connecting points 316a-b, 326a-b. However, the thicker stress nitride/thicker sidewall spacer causes the main bodies 318a-b, 328a-b of the plates 310a-b, 320a-b to move closer together. As with the previously described embodiment, as the plates move closer together, the portion of each plate that is adjacent to a node will curve (i.e., bend), but the main body 318a-b, 328a-b of each plate will remain approximately planar and perpendicular to the opposite node.

Those skilled in the art will recognize that while it is not necessary to form bended plates at process 716 (see FIG. 1b), such bends 1115a-b, 1125a-b provide additional torque to the plates 310a-b, 320a-b once they are released from the dielectric material and the sacrificial portion at process 720. This torque further enhances the collapsing of the plates, regardless of whether the collapse is accomplished using a wet rinse (722), a stressed nitride film (724) or sidewall spacers (726).

Furthermore, although the illustration of the bended plates in FIG. 11a shows the bends for the first half of the conductive plates (e.g., plates 310a and 320a) in the same direction and the bends for the second half of the conductive plates (e.g., plates 310b and 320b) in the opposite direction, it is also anticipated that all of the conductive plates could bend in the same direction. More specifically, during process 720 these bends cause torque, which enhances the process 718 that reduces the size of the spaces between the conductive plates. If the plates on one half of the structure are bent in one direction and the plates on the other half of the structure are bent in the opposite direction, the torque can be balanced causing the plates to collapse towards the center. However, if all of the plates are bent in the same direction, the torque from all of the plates is in the same direction such that the plates will tend to collapse more towards one end of the structure.

Similarly, although the illustrations of FIGS. 5 and 6 show the thicker film layer or thicker spacer, respectively, on the same side of each plate, it is also anticipated that for the first half of the conductive plates (e.g., plates 310a and 320a) the thicker stressed film layer/sidewall spacer could be positioned on one side and for the second half of the conductive plates (e.g., plates 310b and 320b) the thicker stressed film layer/sidewall spacer could be positioned on the opposite side. More specifically, during process 720, the thicker stressed film layer/sidewall spacer on one side can cause the conductive plates to collapse in on the air gaps between the plates and can, thereby, reduce the size of the spaces 365. If the thicker stressed film layer/sidewall spacer is on the same side of all of the plates, the plates will tend to collapse towards one end, as illustrated in FIGS. 5 and 6. However, if the plates on half of the structure have the thicker stressed film/sidewall spacer on one side and the plates on the other half of the structure have the thicker stressed film/sidewall spacer on the opposite side, the collapse of the plates can be directed towards the center.

Additionally, the angle at which each plate extends from a node (i.e., the first and second angles 314a-b, 324a-b) will vary from plate to plate, depending upon a number of factors. For example, if during the formation process, the structure is configured so that the plates will collapse towards the center (as discussed above), then center plates will extend outward from the node at a steeper angle than outer plates. Similarly, if during the formation process, the structure is configured so that the plates will tend to collapse towards one end (as discussed above), then the plates at that one end will extend outward from the node at a steeper angle than plates at the opposite end.

Upon completion of the structure 300, further processing can be performed, for example, additional interconnects can be formed to connect the structure to other devices on the wafer.

Therefore, disclosed above, are embodiments of a capacitor with inter-digitated vertical plates and a method of forming the capacitor such that the effective gap distance between the vertical plates is reduced (i.e., the spacing between the main bodies of the conductive plates is reduced). This gap width reduction significantly increases the capacitance density of the capacitor over prior art vertical natural capacitors. This gap width reduction process is accomplished during back end of the line processing by etching the dielectric material from between the vertical plates and by etching a sacrificial material from below the vertical plates. Etching of the dielectric material from between the plates forms air gaps and various techniques can be used to cause the plates to collapse in on these air gaps, once the sacrificial material is removed. Any remaining air gaps can be filled by depositing a second dielectric material (e.g., a high k dielectric), which will further increase the capacitance density and will encapsulate the capacitor. Encapsulation of the capacitor structure ensures that the reduced spacing between the vertical plates is permanent and further protects the device during subsequent processing of the chip circuitry.

The benefits provided by the disclosed vertical natural capacitor are of significant interest to semiconductor device manufacturers. Specifically, due to the increased capacitance density, the capacitor can be used for various applications including, logic and analog/mixed signal applications. More specifically, in logic and radio frequency (RF) circuits, the capacitor can be used for decoupling applications. In addition, the increased capacitance density also allows the chip layout area to be reduced, thereby, reducing the die cost and the chip size.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation and that the figures are not drawn to scale. Furthermore, those skilled in the art will recognize that the embodiments of the invention can be practiced with modification within the spirit and scope of the appended claims.

What is claimed is:

1. A capacitor comprising:
   a substrate;
   at least two nodes above said substrate, said nodes comprising:
     a first node; and
     a second node parallel to said first node; and
   a plurality of vertical conductive plates that extend between said first node and said second node,
     wherein said conductive plates are alternately connected to only one of said first node and said second node at corresponding connecting points such that adjacent conductive plates are connected to different nodes,
     wherein each conductive plate comprises:
       a main body that is planar, approximately parallel to the main bodies of any adjacent conductive plates and approximately perpendicular to said first node and said second node; and
       a curved portion extending from said main body to a corresponding connecting point on one of said first node and said second node, and
     wherein a first spacing between two corresponding connecting points of two adjacent conductive plates connected to said different nodes is greater than a second spacing between said main bodies of said two adjacent conductive plates, said first spacing and said second spacing being measured along a horizontal axis.

2. The capacitor of claim 1, wherein said conductive plates have a width that is less than approximately 200 nm and wherein said width is at least four times greater than said second spacing.

3. The capacitor of claim 1, wherein each of said conductive plates comprises a plurality of metal levels that are separated by a dielectric material and that are electrically connected by vias.

4. The capacitor of claim 3, wherein said dielectric material has a dielectric constant that is less than approximately 3.9.

5. The capacitor of claim 3, wherein said dielectric material has a dielectric constant that is less than approximately 2.2.

6. The capacitor of claim 3, further comprising a second dielectric material between and encapsulating said conductive plates.

7. The capacitor of claim 1, wherein first angles of first curved portions of first conductive plates connected to said first node differ and wherein second angles of second curved portions of second conductive plates connected to said second node differ.

8. A capacitor comprising:
   a substrate;
   at least two nodes above said substrate, said nodes comprising:
     a first node; and
     a second node parallel to said first node; and
   a plurality of vertical conductive plates that extend between said first node and said second node,
     wherein said conductive plates are alternately connected to only one of said first node and said second node at corresponding connecting points,
     wherein each conductive plate comprises:
       a main body that is planar, approximately parallel to the main bodies of any adjacent conductive plates and approximately perpendicular to said first node and said second node; and
       a curved portion extending from said main body to a corresponding connecting point on one of said first node and said second node, and
     wherein a first spacing between two corresponding connecting points of two adjacent conductive plates connected to said different nodes is greater than a second spacing between said main bodies of said two adjacent conductive plates, said first spacing and said second spacing being measured along a horizontal axis, and
     wherein said conductive plates have a width that is less than approximately 200 nm and wherein said width is at least four times greater than said second spacing.

9. The capacitor of claim 8, wherein each of said conductive plates comprises a plurality of metal levels that are separated by a dielectric material and that are electrically connected by vias.

10. The capacitor of claim 9, wherein said dielectric material has a dielectric constant that is less than approximately 3.9.

11. The capacitor of claim 9, wherein said dielectric material has a dielectric constant that is less than approximately 2.2.

12. The capacitor of claim 9, further comprising a second dielectric material between and encapsulating said conductive plates.

13. The capacitor of claim 8, wherein first angles of first curved portions of first conductive plates connected to said first node differ and wherein second angles of second curved portions of second conductive plates connected to said second node differ.

14. A capacitor comprising:
    a substrate;
    at least two nodes above said substrate, said nodes comprising:
      a first node; and
      a second node parallel to said first node; and
    a plurality of vertical conductive plates that extend between said first node and said second node,
      wherein said conductive plates are alternately connected to only one of said first node and said second node at corresponding connecting points,
      wherein each conductive plate comprises:
        a main body that is planar, approximately parallel to the main bodies of any adjacent conductive plates and approximately perpendicular to said first node and said second node; and
        a curved portion extending from said main body to a corresponding connecting point on one of said first node and said second node, and
      wherein a first spacing between two corresponding connecting points of two adjacent conductive plates connected to said different nodes is greater than a second spacing between said main bodies of said two adjacent conductive plates, said first spacing and said second spacing being measured along a horizontal axis, and
      wherein each of said conductive plates comprises a plurality of metal levels that are separated by a dielectric material and that are electrically connected by vias.

15. The capacitor of claim 14, wherein said conductive plates have a width that is less than approximately 200 nm and wherein said width is at least four times greater than said second spacing.

16. The capacitor of claim 14, wherein said dielectric material has a dielectric constant that is less than approximately 3.9.

17. The capacitor of claim 14, wherein said dielectric material has a dielectric constant that is less than approximately 2.2.

18. The capacitor of claim 14, further comprising a second dielectric material between and encapsulating said conductive plates.

19. The capacitor of claim 14, wherein first angles of first curved portions of first conductive plates connected to said first node differ and wherein second angles of second curved portions of second conductive plates connected to said second node differ.

* * * * *